(12) United States Patent
Tinnes

(10) Patent No.: US 7,642,515 B2
(45) Date of Patent: Jan. 5, 2010

(54) COMPONENT FOR DETECTING ESPECIALLY INFRARED ELECTROMAGNETIC RADIATION

(75) Inventor: Sebastien Tinnes, Tullins (FR)

(73) Assignee: ULIS, Veurey Voroize (FR)

( * ) Notice: Subject to any disclaimer, the term of this patent is extended or adjusted under 35 U.S.C. 154(b) by 258 days.

(21) Appl. No.: 11/719,772

(22) PCT Filed: Dec. 12, 2005

(86) PCT No.: PCT/FR2005/051073

§ 371 (c)(1),
(2), (4) Date: May 21, 2007

(87) PCT Pub. No.: WO2006/067344

PCT Pub. Date: Jun. 29, 2006

(65) Prior Publication Data

US 2009/0140149 A1     Jun. 4, 2009

(30) Foreign Application Priority Data

Dec. 21, 2004   (FR)   .................................. 04 13634

(51) Int. Cl.
G01J 5/02      (2006.01)
(52) U.S. Cl. .................................. 250/352; 250/338.1
(58) Field of Classification Search .................. 250/352, 250/338.1
See application file for complete search history.

(56) References Cited

U.S. PATENT DOCUMENTS

| | | | |
|---|---|---|---|
| 4,743,762 A * | 5/1988 | Gaalema et al. | .......... 250/336.1 |
| 5,334,829 A * | 8/1994 | Ueno et al. | .............. 250/208.1 |
| 5,420,419 A | 5/1995 | Wood | |
| 5,423,119 A * | 6/1995 | Yang | .............................. 29/841 |
| 5,560,851 A * | 10/1996 | Thimm et al. | ................ 219/543 |
| 5,763,885 A | 6/1998 | Murphy et al. | |
| 5,914,488 A | 6/1999 | Sone | |
| 6,690,583 B1 | 2/2004 | Bergstedt et al. | |
| 2003/0098445 A1 * | 5/2003 | Higuma et al. | .............. 252/500 |
| 2004/0147056 A1 * | 7/2004 | McKinnell et al. | ............ 438/52 |
| 2005/0118404 A1 * | 6/2005 | Hamilton et al. | ............ 428/210 |
| 2005/0211900 A1 * | 9/2005 | Ouvrier-Buffet | ....... 250/339.11 |

FOREIGN PATENT DOCUMENTS

JP           05256693         3/1993
WO    WO 2004006290 A2 *   1/2004

OTHER PUBLICATIONS

PCT/ISA/210 for PCT/FR2005/051073, dated Apr. 5, 2006.

* cited by examiner

*Primary Examiner*—David P Porta
*Assistant Examiner*—Shun Lee
(74) *Attorney, Agent, or Firm*—Heslin Rothenberg Farley & Mesiti P.C.

(57) ABSTRACT

A component for detecting electromagnetic radiation comprises: a housing defining a chamber placed under a vacuum or underpressure, one of the faces of the housing including a window which is transparent to the radiation to be detected and the chamber including at least one detector which is used to detect the radiation in question and is arranged inside said chamber essentially against the transparent window, a getter in order to maintain the vacuum or underpressure in the chamber at an acceptable level, and a thermal stabilization device for ensuring regulation of temperature of the detector(s). The thermal stabilization device consists of a heating resistive element which is integrated into the mass of one of the walls defining the housing.

14 Claims, 2 Drawing Sheets

COMPONENT FOR DETECTING ESPECIALLY INFRARED ELECTROMAGNETIC RADIATION

CROSS REFERENCE TO RELATED APPLICATIONS

This application is a Section 371 filing of International Application No. PCT/FR2005/051073 filed on Dec. 12, 2005, and published, in French, as International Publication WO 2006/067344 on Jun. 29, 2006, which claims priority of French Patent Application No. 0413634 filed on Dec. 21, 2004, which applications are hereby incorporated by reference herein, in their entirety.

BACKGROUND ART

The invention relates to a component for detecting electromagnetic radiation, particularly infrared radiation.

Such a component is more particularly intended to be fitted as an optical imaging component, in an infrared camera for example, which operates at ambient temperature in order to constitute what is referred to in the field in question as an "electrical infrared imaging retina".

In infrared imaging, it may be necessary to place the actual detector inside a chamber where there is a more or less hard vacuum in order to allow correct operation of the detector(s) used and in order to obtain maximum sensitivity to variations in the temperature of observed scenes.

A pressure less than $10^{-2}$ millibars is frequently required in order for such a detector to operate satisfactorily. Detectors are therefore encapsulated in a hermetic enclosure inside which the required vacuum or low-pressure atmosphere has been created.

Consequently, when a biometric detector is used, as is often the case in the field of infrared imaging at ambient temperature, it is also necessary to stabilise the temperature of said detector(s) in order to obtain better performance as well as the required sensitivity in terms of accuracy in respect of the temperature of observed scenes.

Such temperature stabilisation is conventionally achieved by using a thermoelectric module, for instance a peltier-type thermoelectric module associated with a PID (Proportional Integral Derivative) controller as well as a thermal sensor placed close to or inside the detector that is to be stabilised and hence inside the enclosure defined by the above-mentioned housing.

An encapsulation package of a bolometric detector in accordance with the prior art is described below in relation to FIG. 1, which is a schematic view.

This essentially comprises a substrate (1) made of a ceramic material or metal or even a combination of both these types of materials. In this case, substrate (1) constitutes the base of the package. It has lateral walls (2) and is hermetically sealed by means of a lid (3) on its upper surface. Lid (3) has a window (4) which is transparent to the radiation to be detected, in this case infrared, and, for instance, transparent to radiation having wavelengths of 8 to 12 µm or between 3 and 5 µm which are common detection wavelengths.

A chamber or enclosure (5) inside which there is a vacuum or low pressure, typically a pressure less than $10^{-2}$ millibars, is thus defined. The elements that form this chamber (5) are sealed so that the leak rate in helium is less than $10^{-12}$ mbar·l/s.

Inside this chamber, substrate (1) accommodates the actual detector, especially one or more bolometric detectors, located underneath window (4). This or these bolometer(s) (6) is/are associated with an interfacing circuit (7), this assembly or chip being associated with a thermoelectric module (8) attached to a substrate (1), for example by soldering or epoxy bonding. As already stated, this module is intended to ensure control of the temperature of the chip in order, in particular, to act as a reference with regard to the variable analysed by detector (6) and, on this basis, in order to ensure a certain degree of reproducibility of measurements made.

This microbolometer and interfacing circuit assembly (6, 7) is also electrically connected to its environment by means of a wired connection (9) associated with a standard input/output (10) which passes through said substrate (1) and is linked to the electronics of the device in which it is fitted, for example a camera, by means of an interconnection and operating circuit (11).

The heat produced by thermoelectric module (8) is dissipated by means of heatsink (12) placed against the lower surface of substrate (1) and located substantially vertically underneath said module.

In order to maintain the vacuum inside chamber (5), a means capable of absorbing and, generally speaking, pumping the gas molecules released during use of the detecting component is installed inside the chamber, such means being referred to as a "getter".

This getter (13) is connected to an electric power input (14) which passes through substrate (1), said input also being connected to interconnection circuit (11).

In order to achieve optimum efficiency in terms of thermal control, the thermoelectric module is traditionally placed inside the housing where there is a vacuum or low-pressure atmosphere.

Nevertheless, the possibility of locating this module outside the housing has been considered, thereby making it easier to fabricate the housing and obtain a vacuum inside it, but penalising firstly the efficiency of thermal control in the bolometric detector and secondly the power consumption of said thermoelectric module (see, for instance, Document U.S. Pat. No. 5,914,488 which describes an equivalent principle using a heating module instead of a thermoelectric module).

The disadvantage of incorporating a thermoelectric module and, generally speaking, a thermal stabilisation device inside chamber (5) defined by the housing is essentially the fact that it makes the housing more complex.

In fact, firstly it is necessary to increase the height of the housing, typically by 1.5 to 4.5 mm and, consequently, its overall dimensions for such a device.

Secondly, special-purpose power supply pins must also be provided in order to electrically connect the thermal stabilisation device.

Finally, assembly and outgassing temperatures must be limited to the maximum temperatures which the thermal stabilisation device can withstand.

On the other hand, in the case of a configuration where the stabilisation device or thermal control device is located outside the housing, the power consumption of said device is excessive and the overall dimensions of the entire system, consisting of the housing and the thermal stabilisation device, are larger. This also makes the process of assembling the housing on a PCB more complex (method of connection to PCB, report temperature, etc.).

In addition and regardless where the temperature control device is located, i.e. inside or outside the housing, integrating it with the housing is expensive, in particular due to the cost of manufacturing the actual control device but also because of costs incurred by fitting this device in the housing and costs associated with the specific layout features of the housing in order to accommodate such a control device.

BRIEF SUMMARY OF THE INVENTION

The object of the present invention is essentially to overcome these various drawbacks. It therefore aims to integrate the temperature control device, more particularly a heating device, in the mass of one of the walls of the encapsulation package, particularly in the base of said package. To achieve this, the invention involves preferential use of cofired ceramics technology to produce the walls of the package.

According to the invention, the component for detecting electromagnetic radiation, particularly infrared radiation comprises:
- a housing defining a chamber placed under a vacuum or underpressure, one of the faces of said housing consisting of a window which is transparent to the radiation to be detected and comprising at least one detector which is used to detect the radiation in question and is arranged inside said chamber essentially against the transparent window,
- a means for pumping the residual gases or getter in order to maintain the vacuum or underpressure in the chamber at an acceptable level,
- a thermal stabilisation device for ensuring the regulation of the detector(s) in terms of temperature.

According to the invention, the thermal stabilisation device consists of a heating resistive element which is integrated into the mass of one of the walls defining the housing, particularly in its base.

The wall, and hence the base in this case, is made of a cofired ceramic and comprises at least two successive ceramic layers attached to each other by firing:
- an upper layer to which the detector(s) is/are attached by soldering or epoxy bonding;
- a lower layer that includes, on its face that is in contact with the upper layer, said electric resistive device obtained by screen printing, this lower layer being attached to said upper layer by firing.

In this way, only one resistive element is integrated as a thermal stabilisation device in the mass of the wall and, more particularly, the base of the encapsulation package of the detection component according to the invention. This resistive element is monitored by a PID controller outside the housing. To achieve this, it is electrically connected to one or more electrical outputs of the housing in the same way as any other track by the component. The connection of the housing to the PCB, also referred to as the interconnection circuit (11), is used to ensure that the PID controller is linked to the resistive element.

This heating resistive element may have various patterns, particularly straight, coiled, spiral etc., the objective being to obtain a temperature that is as uniform as possible on the detector whereof the temperature is to be controlled or stabilised.

According to another aspect of the invention, a device for increasing the thermal resistance between the above-mentioned integrated heating device and the external environment is also integrated in the mass of the wall, particularly the base of the housing.

To achieve this, the base produced as described earlier, is associated with a third lower layer provided with a certain number of cavities of any shape filled with air and opening out into the external environment, thus minimising the surface contact between the housing and printed interconnection circuit (11).

In another embodiment of the invention, a second cavity is defined in the base of the housing to ensure thermal insulation, said second cavity communicating with the upper cavity that accommodates, in particular, the assembly consisting of the detector(s) and its/their interfacing circuit(s) (6, 7) via through-openings made in the layers of cofired ceramics that contain the resistive element of the thermal stabilisation device.

BRIEF DESCRIPTION OF THE DRAWING FIGURES

The way in which the invention is implemented and its resulting advantages will be made more readily understandable by the following description, given merely by way of example, reference being made to the accompanying drawings.

As stated earlier,

DETAILED DESCRIPTION

Figure 1:
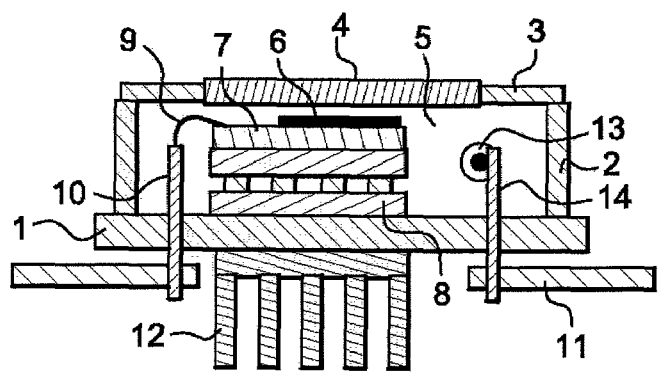
FIG. 1 is a schematic cross-sectional view of a device according to the prior art.

Elements that are common to the diagram illustrating the prior art and those illustrating the invention are given identical reference numbers in the following description.

The detection component according to the invention comprises, as in the case of the prior art, a housing that is hermetically sealed so as to at least limit leakage to a value approaching $10^{-12}$ mbar·l/s in helium.

This housing comprises a substrate made of a cofired ceramic (1), described below in greater detail, on which one or more microbolometers (6) associated with an interfacing circuit (7) are mounted by soldering or epoxy bonding. Interfacing circuit (7) is itself advantageously equipped with a thermal sensor (23), the purpose of which is to continuously optimise thermal control of the chip consisting of assembly (6, 7) in a known manner.

The upper face of this housing is closed by a lid (3) that has a window (4) which is transparent to the radiation to be detected, in this case transparent to infrared radiation.

According to another fundamental aspect of the invention, a heating resistive element that belongs to a thermal stabilisation device in the cavity defined inside the housing and involved in thermal control of bolometric detector(s) (6) is integrated into the mass of substrate (1).

In the example described, substrate (1) is a triple-layer substrate. Intermediate layer (16), made of a ceramic, accommodates, on its upper face, i.e. its face that points towards chip (6, 7), a heating resistive element (18).

In order to electrically insulate this resistive element from said chip (6, 7), an upper layer (17), also made of a ceramic, is placed on top of intermediate layer (16).

Assembly (16, 17, 18) is intended to ensure uniform heating of chip (6, 7) by the Joule effect in order to keep, spatially and temporally, the temperature of the chip several degrees above ambient temperature.

As stated earlier, heating resistive element (18) is applied by screen printing conductors in the form of ink on sheets of untreated ceramics. In a known manner, these ceramic sheets, before being cofired and therefore baked, are in a non-rigid form and therefore soft or flexible and, using the technique in question, are called "raw".

Thus, several ceramic sheets with various conductor patterns and routings can be placed one on top of the other so as to obtain the desired profile for the heating resistive element and, consequently, ensure that heating of the overlying chip is as uniform as possible.

Electrical communication between the conductive tracks at two different levels is ensured by vias (not shown).

Once the raw screen-printed ceramic sheets have been assembled, aligned and compressed using tooling that is familiar to those skilled in the art, they are fired at high temperature and under pressure in order to join the sheets to each other. The assembly thus obtained is rigid and then can be cut into individual modules that constitute both the two layers (16, 17), for example, of substrate (1). This assembly (16, 17) is associated with one or two ceramic layers (15) in order to insulate the heating resistive element (18) from the printed interconnection circuit (11).

In addition, the actual cavity (5) is defined by adding peripheral ceramic layers (21, 22) on substrate (1) during the production of said substrate. Thus, ceramic layers (15, 16, 17, 21, 22) are all assembled together and cofired simultaneously.

Figure 2:
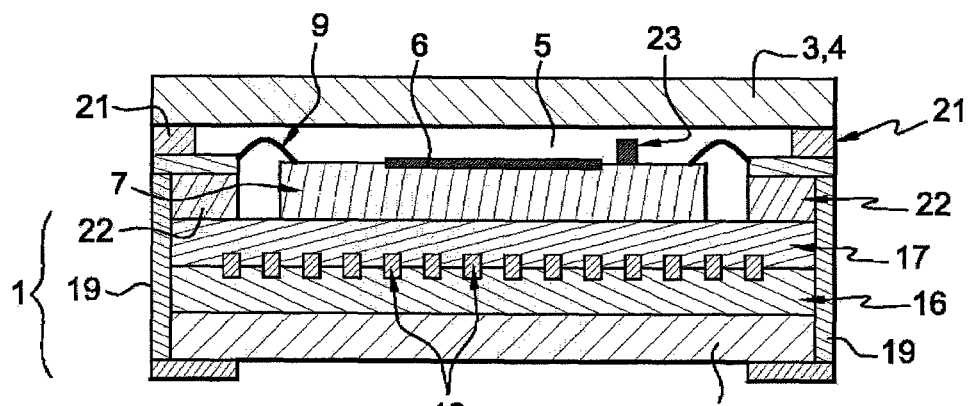
FIG. 2 is a schematic cross-sectional view of a first embodiment of the detection component according to the invention.

There are two main types of technologies for firing such ceramics:

So-called LTCC (Low Temperature Cofired Ceramic) technology where firing takes place at around 800° C. and where the electrical conductors are produced using silver-based inks;

So-called HTCC (High Temperature Cofired Ceramic) technology where the firing temperature is of the order of 1,500° C. and where the electrical conductors are produced using inks based on refractory metals of the tungsten type;

In the embodiment described in relation to FIG. 2, HTCC technology is used in particular. In fact, internal electrical conductors of the tungsten type are, as is known, more resistive than silver-based conductors and this facilitates the use of conductive tracks as resistances for the Joule-effect heating required for the chip.

In addition, HTCC technology makes it possible to work with an aluminium-oxide type substrate having an average thermal conductivity of 15 to 20 W/m/K, or even an AlN (aluminium nitride) type substrate offering better thermal conductivity (180 W/m/K), thus encouraging the spread of heat near the chip.

The illustration in FIG. 2 is a cross-sectional view. One can see heating resistive element (18) which can be assumed to be a succession of coils or spirals, the reader being reminded that the sought-after objective is to ensure that the spread of heat is as uniform as possible at the level of the chip that is to be temperature controlled.

The use of screen printing provides a very large degree of freedom in terms of the shape or design of the resistive element.

Typically, the aim is to dissipate 10 mW to 5 W.

Figure 3:
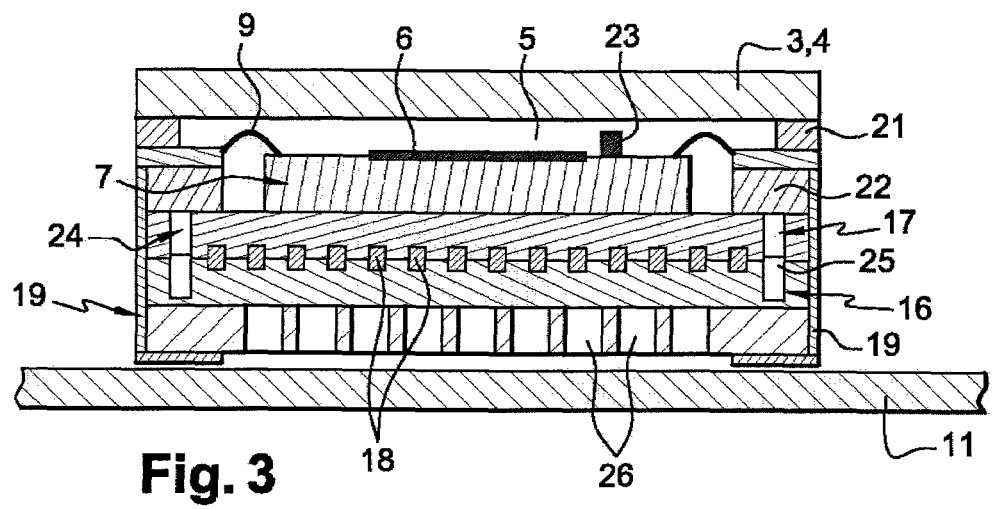
FIG. 3 is a schematic cross-sectional view of a second embodiment of the detection component according to the invention.

Advantageously and in order to reduce heat losses and consequently reduce the power consumption of the device, the invention proposes reducing the heat conducting or contact surface area between substrate (1), formed as previously, and printed interconnection circuit (11). This results in an embodiment of the invention which is described below, reference being made to FIG. 3.

One adds, to the two cofired ceramic layers (16, 17) mentioned earlier, a layer (15) made of the same material, the central area of which has cavities (26) of any profile, particularly parallelepiped, cylindrical etc. which are linked to the same external environment. This limits the contact areas between the substrate and interconnection circuit (11) and, consequently, heat losses due to the inherent conduction of the material of which said substrate is made.

Cavities (26) are made so as to avoid any risk of upper layers (16) and (17) of the substrate sinking, for instance by adhering to a ratio of a least four to one for the dimensions of the cavities and the dimensions of the columns that define said cavities. For example, one selects cavities that are 2 mm wide and have a 2.5 mm spacing pitch. Consequently, the peripheral edges of layer (15) have no such cavities in order to allow, in particular, the placement of electrical contacts (19) near the lateral walls, these contacts carrying electrical signals between chip (6, 7) or heating resistive element (18) and printed interconnection circuit (11).

Upper layers (16) and (17) may also have cavities (24, 25) in order to limit losses by conduction at the level of the lateral faces of the ceramic that constitutes the substrate.

Figure 4:
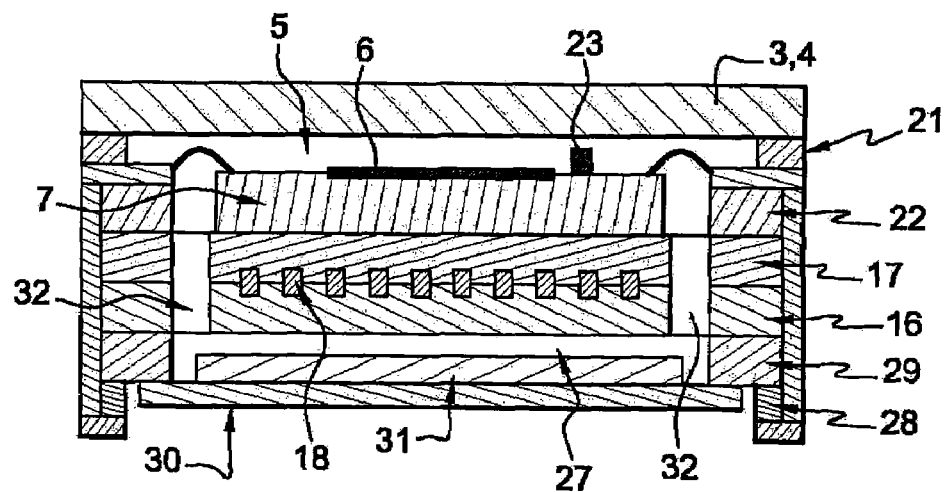
FIG. 4 is a schematic cross-sectional view of a third embodiment of the detection component according to the invention and FIG. 5 is a top view after removing the window which is transparent to the radiation to be detected.
Figure 5:
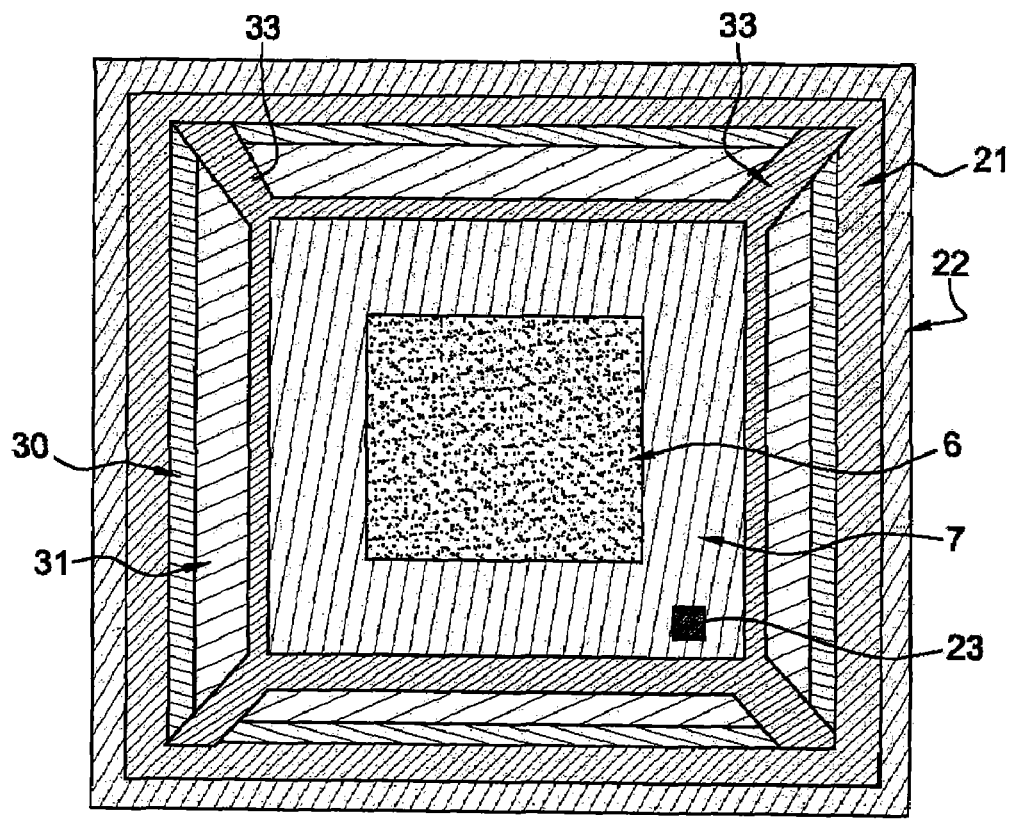

Another embodiment of the invention which is described below, reference being made to FIGS. 4 and 5, can also be envisaged, still with the aim of limiting heat losses.

In this embodiment, assembly (16, 17, 18) is kept the same as that described in relation to FIG. 2. This being so, an upper cavity (5) is defined in the upper part of the housing, said cavity accommodating, in particular, chip (6, 7) and being kept, the reader is reminded, in a vacuum approaching $10^{-2}$ millibars.

Consequently, a second so-called "lower" cavity or "thermal insulation cavity" (27) is defined by using two additional levels of ceramic layers (28, 29), said cavity being closed off, typically by soldering, at the level of its lower base by a metal plate (30). The latter is capable of accommodating a getter (31) produced by Physical Vapour Deposition (PVD) or separately mounted by soldering it onto metal plate (30) or by any other means.

Upper cavity (5) and lower cavity (27) communicate with each other by means of openings (32) made in assembly (16, 17). This being so, the pressure of the vacuum in each of these two cavities is always identical.

Layers (16, 17) are physically continuous with the rest of the housing thanks to a least one element and, for instance, thanks to four arms or junctions (33) which firstly physically support chip (6, 7) above lower thermal insulation cavity (27) and secondly make it possible to route the electrical contact of heating resistive element (18) to the appropriate outputs of the housing by means of an electrical conductor which is screen printed at the same time as said resistive element (18). These four arms or junctions (33) are, for example, positioned substantially in the four corners of layers (16, 17).

Openings (32) make it possible to increase the thermal insulation in the plane of chip (6, 7), thereby reducing the heat loss inherent in conduction through junctions (33).

Vacuum cavity (27) therefore provides thermal insulation between heating resistive element (18) and the base of the housing which consists mainly of lower ceramic layer (28) which is itself in direct contact with the external environment.

This thermal insulation plus the thermal insulation inherent in openings (32) makes it possible to reduce the power consumption of the heating resistive element significantly thanks to reduced heat losses.

In addition, this embodiment ensures a certain degree of thermal uniformity inside the housing with the latter becoming markedly less sensitive to variations in external environmental conditions and to the configuration in which it is assembled on the PCB, of a camera for example.

The present invention has a certain number of advantages, the main ones are described below.

Firstly, in terms of overall dimensions: if the base of an encapsulation package consists of a least two ceramic levels, as it often does, adding a screen-printed pattern has no impact on its overall dimensions.

This gives an encapsulated device having extremely small overall dimensions because the chamber of said housing is reduced by the thickness of the thermoelectric module. If, on the other hand, it becomes necessary to add a ceramic level to the substrate, the latter has a typical thickness of 0.2 to 0.5 mm which is nevertheless still thin compared with previous technologies which necessitate an increased thickness of 1.5 to 4.5 mm.

The extra cost incurred is confined to the additional ceramic at the level of the substrate with screen printing. This is marginal compared with the cost of the external thermal control device added to the base of a housing as required by the prior art.

In addition, the high temperature used to carry out the firing stage is not a limiting factor in terms of assembly or outgassing temperatures, in contrast to the situation with devices that use a peltier-type thermal control device.

Finally, the resistive pattern or heating element is directly connected to the outputs of the housing during fabrication of the product and no special stage is therefore needed in order to connect the control device to the housing.

The invention claimed is:

1. A component for detecting electromagnetic radiation, comprising:
   a housing defining a chamber placed under a vacuum or underpressure, the housing comprising a substrate forming a base of the housing, lateral walls adjoined to the substrate, and a lid, the lid including a window which is transparent to the radiation to be detected, said chamber receiving at least one detector which is used to detect the radiation and is arranged inside said chamber essentially against the transparent window,
   a getter to maintain the vacuum or underpressure in the chamber at an acceptable level, and
   a thermal stabilisation device for ensuring regulation of temperature of the at least one detector, wherein
   the thermal stabilisation device comprises a heating resistive element integrated into mass of the substrate forming the base of the housing.

2. A component for detecting electromagnetic radiation as claimed in claim 1, wherein the substrate comprises ceramic layers sandwiching said heating resistive element, the lateral walls comprising peripheral ceramic layers, and the ceramic layers of the substrate and of the lateral walls are assembled together and co-fired simultaneously.

3. A component for detecting electromagnetic radiation as claimed in claim 1, wherein the substrate is made of a ceramic and comprises at least two ceramic layers attached to each other by co-firing, said at least two ceramic layers comprising:
   an upper ceramic layer on which the at least one detector is attached by soldering or epoxy bonding;
   and a lower ceramic layer that includes, on a face that is in contact with the upper layer, heating resistive element obtained by screen printing, said lower layer being attached to the upper layer by co-firing.

4. A component for detecting electromagnetic radiation as claimed in claim 3, wherein the heating resistive element of the thermal stabilisation device has a pattern adapted to ensure that temperature at a level of the at least one detector is uniform.

5. A component for detecting electromagnetic radiation as claimed in claim 4, wherein the pattern is straight, coiled or spiral.

6. A component for detecting electromagnetic radiation as claimed in claim 3, wherein means for increasing thermal resistance between the heating resistive element of the thermal stabilisation device and an interconnection or read circuit is also integrated into the mass of the base.

7. A component for detecting electromagnetic radiation as claimed in claim 6, wherein said means for increasing the thermal resistance comprises cavities having a profile in a lower layer of the substrate of the base designed to reduce contact surface area between said substrate and the interconnection circuit.

8. A component for detecting electromagnetic radiation as claimed in claim 6, wherein said means for increasing the thermal resistance comprises a thermal insulation cavity defined in the base of the housing and communicating with the chamber via through-openings made in the co-fired ceramic layers that accommodate the heating resistive element of the thermal stabilisation device.

9. A component for detecting electromagnetic radiation as claimed in claim 8, wherein the thermal insulation cavity is defined by co-fired ceramic layers and said cavity is closed off at a level of a base of the cavity by a metal plate for accommodating said getter.

10. A component for detecting electromagnetic radiation as claimed in claim 8, wherein the ceramic layers accommodating the heating resistive element of the thermal stabilisation device are physically continuous with a rest of the housing via at least one element adapted firstly to physically support the at least one detector and an interfacing circuit above the thermal insulation cavity and secondly to allow routing of electrical contact of the heating resistive element to outputs of the housing by an electrical conductor screen printed at a same time as said resistive element.

11. A component for detecting electromagnetic radiation as claimed in claim 10, wherein the at least one element that ensures physical continuity of the co-fired ceramic layers with the rest of the housing comprises four arms or junctions placed substantially in the four corners of said layers.

12. A component for detecting electromagnetic radiation as claimed in claim 1, wherein the heating resistive element of the thermal stabilisation device is monitored by a controller outside the housing.

13. A component for detecting electromagnetic radiation as claimed in claim 1, wherein the at least one detector and an associated interfacing circuit are mounted on the substrate.

14. The component for detecting electromagnetic radiation as claimed in claim 1, wherein the electromagnetic radiation comprises infrared radiation.

* * * * *